United States Patent [19]

Suzuki et al.

[11] 4,363,001
[45] Dec. 7, 1982

[54] DIGITAL GAIN CONTROL APPARATUS

[75] Inventors: Tadao Suzuki; Tadao Yoshida, both of Tokyo, Japan

[73] Assignee: Sony Corporation, Tokyo, Japan

[21] Appl. No.: 171,454

[22] Filed: Jul. 23, 1980

[30] Foreign Application Priority Data

Jul. 23, 1979 [JP] Japan .................................. 54-93497

[51] Int. Cl.³ .............................................. H03G 9/14
[52] U.S. Cl. .................................... 330/107; 179/1 D; 179/1 VL; 330/144; 330/284; 330/304; 333/28 T; 455/233
[58] Field of Search ............... 330/107, 109, 144, 145, 330/284, 304; 333/28 R, 28 T; 179/1 A, 1 D, 1 VL; 455/177, 200, 233, 249, 267

[56] References Cited

U.S. PATENT DOCUMENTS

4,151,477  4/1979  Yokoyama ........................ 330/107
4,292,467  9/1981  Odlen et al. ..................... 333/28 T

*Primary Examiner*—James B. Mullins
*Attorney, Agent, or Firm*—Hill, Van Santen, Steadman, Chiara & Simpson

[57] ABSTRACT

A digital gain control apparatus includes a digital control signal generator producing a plurality of serial-binary coded signals, a clock pulse signal and a strobe signal. A shift register is supplied with the plurality of serial-binary coded signals and the clock pulse signal from the digital control signal generator. A latch circuit is connected to the output of the shift register and is supplied with the strobe signal from the digital control signal generator to convert the plurality of serial-binary coded signals into a plurality of parallel-binary coded signals. A decoder is connected to the output of the latch circuit to produce a plurality of control signals from the plurality of parallel-binary coded signals. A function selector circuit and a volume adjusting circuit for the selected functions is also provided, each being controlled by the plurality of control signals. The shift register, latch circuit and volume adjusting circuit are formed in one chip-integrated circuit. In one embodiment, a bass and treble tone control circuit is provided which is controlled by the output of the decoder.

7 Claims, 15 Drawing Figures

| Attenuation | S509 | S510 | S511 | S512 | S513 | S514 | S515 | S516 | S517 | S518 | S519 |
|---|---|---|---|---|---|---|---|---|---|---|---|
| 0 | ON | | | | | | | | | | |
| 1 | | ON | | | | | | | | | |
| 2 | | | ON | | | | | | | | |
| 3 | | | | ON | | | | | | | |
| 4 | | | | | ON | | | | | | |
| 5 | | | | | | ON | | | | | |
| 6 | | | | | | | ON | | | | |
| 7 | | | | | | | | ON | | | |
| 8 | | | | | | | | | ON | | |
| 9 | | | | | | | | | | ON | ON |

| Attenuation | S501 | S502 | S503 | S504 | S505 | S506 | S507 | S508 |
|---|---|---|---|---|---|---|---|---|
| 0 | ON | | | | | | | |
| 10 | | ON | | | | | | |
| 20 | | | ON | | | | | |
| 30 | | | | ON | | | | |
| 40 | | | | | ON | | | |
| 50 | | | | | | ON | | |
| 60 | | | | | | | ON | |
| 70 | | | | | | | | ON |

DIGITAL GAIN CONTROL APPARATUS

BACKGROUND OF THE INVENTION

The present invention relates generally to a digital gain control apparatus and is directed more particularly to a digital gain control apparatus suitable to be made as a one chip integrated circuit.

In the art, an audio pre-amplifier is formed of a function selector (phono-tuner-AUX), a volume control circuit, a stereo-monaural mode change-over circuit, a stereo balancer, a bass/treble tone control circuit and so on. In this case, since a number of change-over circuits and resistors are required, it is difficult to make the audio pre-amplifier as an IC (integrated circuit).

Recently, instead of a mechanical switch serving as a change-over circuit, a semiconductor element such as an MOS FET has been practically used for switching a signal with a wide dynamic range without causing any distortion; also a micro-processor has been used widely for complicated signal processings.

However, an audio pre-amplifier to be used in combination with a digital control IC such as a micro processor has not been made as a one chip IC.

OBJECTS AND SUMMARY OF THE INVENTION

Accordingly, an object of the present invention is to provide a digital gain control apparatus free from the defect inherent in the prior art.

Another object of the invention is to provide a digital gain control apparatus made as a one chip IC which is suitable to be used in combination with a micro processor.

In accordance with an example of the present invention, a digital gain control apparatus is provided which includes a digital control signal generator producing a plurality of serial-binary coded signals, a clock pulse signal, and a strobe signal;

a shift register supplied with the plurality of serial-binary coded signals and the clock pulse signal from the digital control signal generator;

a latch circuit connected to the output of the shift register and supplied with the strobe signal from the digital control signal generator to convert the plurality of serial-binary coded signals into a plurality of parallel-binary coded signals;

a decoder connected to the output of the latch circuit to produce a plurality of control signals from the plurality of parallel-binary coded signals;

a function selector;

a volume adjusting circuit for the selected one of functions;

the function selector and volume adjusting circuit being connected to an output of the decoder and controlled by the plurality of control signals; and the shift register, latch circuit, decoder, function selector and volume adjusting circuit being formed in a one chip-integrated circuit.

The other objects, features and advantages of the present invention will become apparent from the following description taken in conjunction with the accompanying drawings.

DESCRIPTION OF THE PREFERRED EMBODIMENTS

The present invention will be hereinafter described with reference to the attached drawings.

Figure 1:
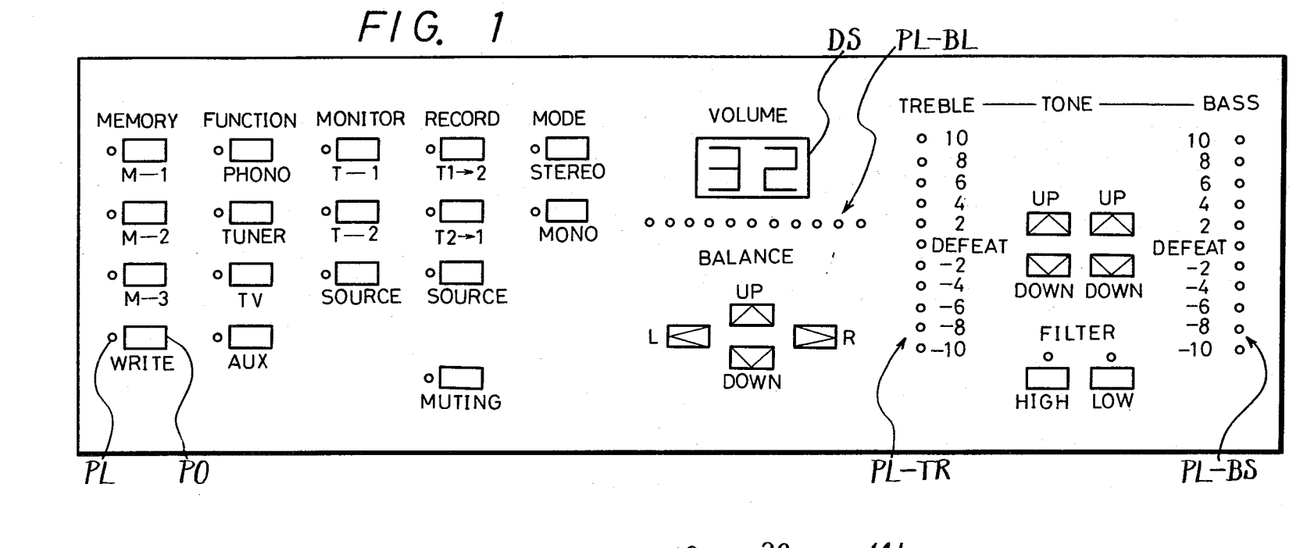
FIG. 1 is a front view of an audio pre-amplifier in which an example of the invention is used.

Turning to FIG. 1 the operation panel of an audio signal control apparatus will be described first. In FIG. 1, reference letters POs designate each operating element or those of a touch switch in this example, PLs each display lamp of a dot-shape (for example, light emission diodes), and DS a numeral display device (using for example, light emission diodes), respectively.

In the column "FUNCTION", there are provided four audio signal selecting operating elements PO and four display lamps PL in correspondence with the respective operating elements PO to display which elements PO are operated. Letters "PHONO", "TUNER", "TV" and "AUX" marked under the respective operating elements PO show record player, radio tuner, television tuner and auxiliary terminals, respectively.

In the column "MONITOR", there are provided three monitor signal selecting operating elements PO and three display lamps PL in correspondence therewith. Letters "T-1", "T-2" and "SOURCE" under the operating elements PO show first and second tape recorders and an instrument or auxiliary terminal selected by operating the elements PO in the column "FUNCTION".

An operating element PO with a display lamp PL and the label "MUTING" designates a muting operating element which, when it is operated, instantaneously reduces the volume or level of the signal being monitored by, for example, 20 dB.

In the column "RECORD", there are provided three record signal selecting operating elements PO and three display lamps PL in correspondence therewith. Operating elements PO with marks of "T1→2", "T2→1" and "SOURCE" show respectively that the reproduced signal from the first tape recorder is fed to the second tape recorder, or vice versa, and the audio signal from the instrument or auxiliary terminal selected by operating the operating elements PO on the column "FUNCTION" is fed as the record signal to the first or second tape recorder.

In the column "MODE" are provided two mode changing operating elements PO for the change between stereo and monaural of the monitor and two display lamps PL in correspondence therewith. Letters "STEREO" and "MONO" respectively show stereo and monaural modes.

In the column "VOLUME", the following elements are provided. The numeral display device DS displays the sound volume of the monitor signal as an attenuation value, in which the attenuation value is displayed as 0, 1, 2, ... 78, 79 dB at the step of 1 dB and also as ∞ dB. In fact, ∞ dB is displayed as, for example, "E". PL-BL or the label "BALANCE" designates a balance display device made of eleven display lamps PL arranged laterally. In this case, when the center display lamp PL is lit, the volumes of the monitor signals at the left and right channels are balanced, and some of the left and right display lamps PL are lit in accordance with unbalanced amount in the monitor signals of the left and right channels. Operating elements PO with the labels "UP", "DOWN", "L" and "R" are respectively ones which show the volume-up, volume-down, left and right level adjustments for the left and right balance adjustment.

In the column "TONE" are provided four operating elements PO for sound volume adjusting. In the column "TREBLE" is provided a treble display device PL-TR consisting of eleven display lamps PL which displays a treble amount in a step manner such as −10, −8, −6, −4, −2, DEFEAT, 2, 4, 6, 8 and 10. At the side of the treble display device PL-TR are provided operating elements PO with the labels "UP" and "DOWN" for up- and down-adjustment of treble amount. In the column "BASS" is provided a bass display device PL-BS consisting of eleven display lamps PL which display in a step manner bass amounts as −10, −8, −6, −4, −2, DEFEAT, 2, 4, 6, 8 and 10. At the side of the base display device PL-BS are provided operating elements PO with the labels "UP" and "DOWN" for the bass-up and -down adjustments. In the column "FILTER" are provided two operating elements PO for adjusting the filter characteristics and two display lamps PL in correspondence therewith. The labels "HIGH" and "LOW" under the elements PO on the column "FILTER" show high and low adjustments of the filter characteristics.

In the column "MEMORY" are provided three operating elements PO for selecting memory portions, single operating element PO for memory-write and four display lamps PL in correspondence therewith. Labels "M-1", "M-2" and "M-3" designate three memory portions, and "WRITE" a write-in, respectively.

With the above audio signal control apparatus, when the operating element PO with the label "WRITE" and either one of those PO with the labels "M-1", "M-2" and "M-3" are operated, the control state is written in either of three memories of a memory 16 (refer to FIG. 2) and stored therein. Further, when either of the elements PO with the labels "M-1", "M-2" and "M-3" is operated, the control state of the audio signal corresponding to the operated element and stored in the memory is read out and the respective members of the audio signal control apparatus are set at the corresponding state.

Figure 2:
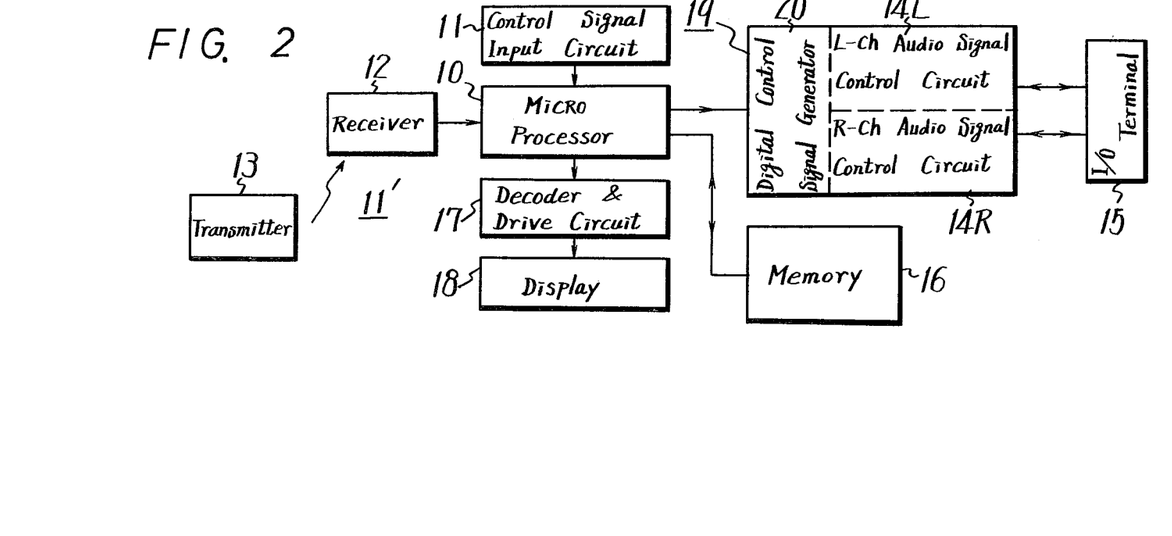
FIGS. 2 and 4 are schematic block diagrams showing an example of the invention.

Turning to FIG. 2, an example of the audio signal control apparatus according to the present invention will be generally described. In FIG. 2, 19 generally designates a digital audio signal control circuit which is made as a one chip IC except for its externally connected parts and which is formed as a plural channel, or in the illustrated example left and right channel audio signal control circuits 14L, 14R and a digital control signal generator 20 producing a digital control signal for controlling the circuits 14L, 14R to which are connected an audio signal input terminal group 15 described later. The digital control signal generator 20 receives a serial binary code signal, a clock signal and a strobe signal from a micro processor (micro computer) 10, and produces a control signal to ON-and OFF-control a number of switches (electronic switches such as PETs with SIPOS gates) in the control circuits 14L and 14R.

In FIG. 2, 11 designates a control signal input circuit formed of a switch (touch switch) group which is operated when the various operating elements PO depicted in FIG. 1 are operated. The signal (control signal) from the control signal input circuit 11 is fed to the micro processor 10. A receiver 12 receives the control signal for the audio signal from a transmitter 13 as a remote control signal with a carrier of, for example, ultrared waves. The receiver 12 and transmitter 13 form a separate control signal input circuit 11'. A display device 18 is provided which includes the display lamps PL, display device DS, display devices PL-BL, PL-TR, PL-BS and so on and performs the display operation by the display control signal from the micro processor 10 through a decoder and drive circuit 17.

Figure 3:
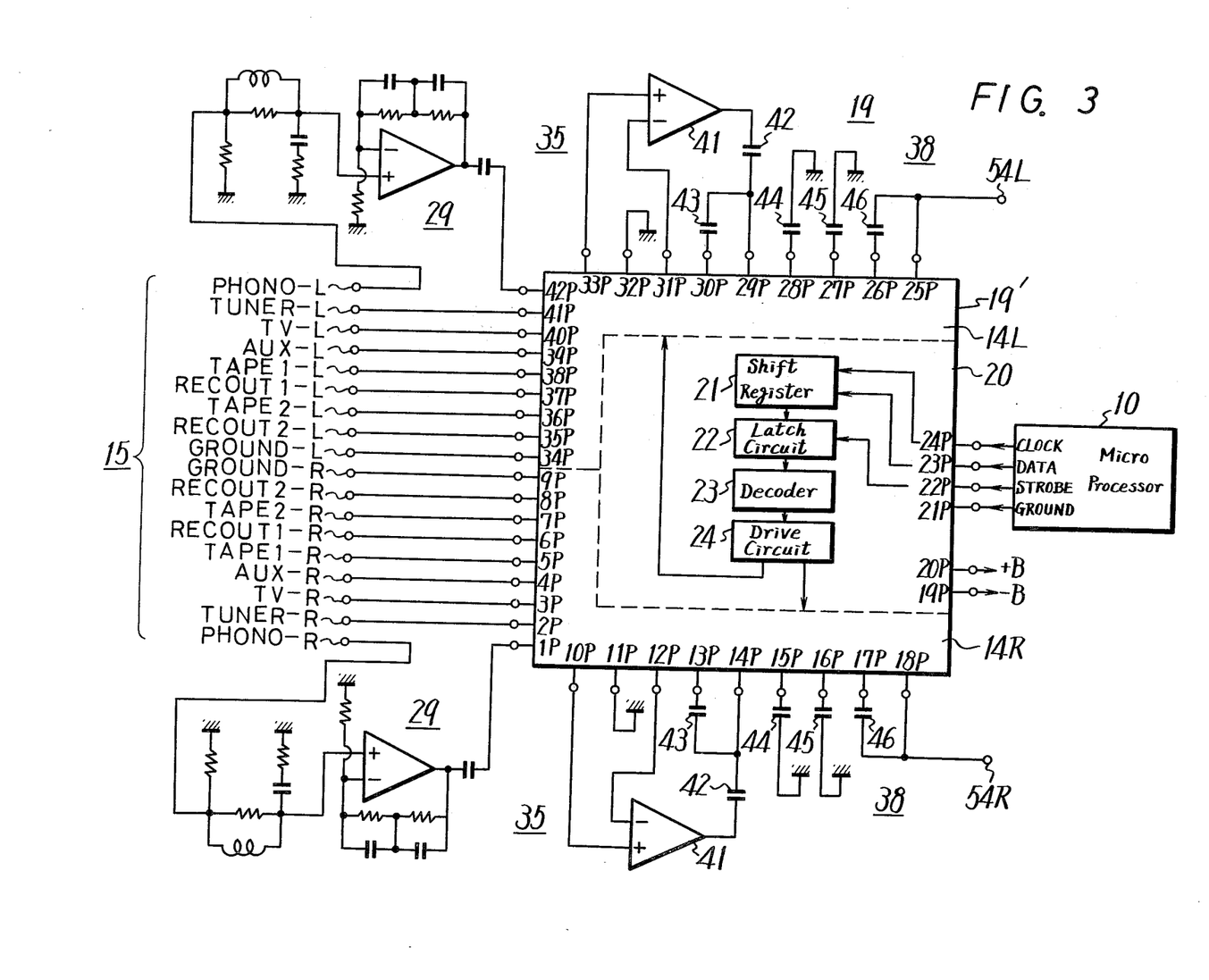
FIG. 3 is a circuit diagram showing, partially in block form, an example of the invention.

Turning to FIG. 3, a practical example of the digital audio signal control circuit 19 will be explained. This control circuit 19 consists of an IC (one chip semiconductor integrated circuit) 19' and an externally connected circuit such as an equalizer amplifier and a tone control amplifier. The IC 19' has pins 1P to 42P, and pins 1P to 9P and 34P to 42P are connected to respective terminals of the audio signal input terminal group 15. Now, the respective terminals of the terminal group 15 will be described. Terminals PHONO-L and PHONO-R are respectively supplied with the signals of the left and right channels reproduced by the record player and connected to the pins 42P and 1P through an equalizer circuits 29 which are well known and whose description will be omitted. Terminals TUNER-L and TUNER-R are respectively supplied with the audio signals of the left and right channels from the radio tuner, and connected to the pins 41P and 2P. Terminals TV-L and TV-R are respectively supplied with the audio signals of the left and right channels from the television tuner, and connected to the pins 40P and 3P. Terminals AUX-L and AUX-R are respectively auxiliary terminals for the left and right channels and respectively connected to the pins 39P and 4P. Terminals TAPE 1-L and TAPE 1-R are respectively supplied with the reproduced signals of the left and right channels from the first tape recorder, and connected to the pins 38P and 5P. Terminals RECOUT 1-L and RECOUT 1-R are respectively supplied with the recording signals of the left and right channels to be fed to the first tape recorder, and connected to the pins 37P and 6P. Terminals TAPE 2-L and TAPE 2-R are respectively supplied with the reproduced signals of the left and right channels from the second tape recorder, and connected to the pins 36P and 7P. Terminals RECOUT 2-L and RECOUT 2-R are respectively supplied with the recording signals of the left and right channels to be fed to the second tape recorder and connected to the pins 35P and 8P. Terminals GROUND-L and GROUND-R are respectively ground terminals for the left and right channels, and are connected to the pins 34P and 9P.

The pins 28P to 33P of the IC chip 19' are respectively connected with the circuit elements of an external circuit such as a tone adjusting circuit 35 for the left channel, and the pins 10P to 15P of the IC chip 19' are respectively connected with the circuit elements of a tone adjusting circuit 35 for the right channel. The tone adjusting circuits 35 for the left and right channels are the same in construction and will be described later in detail with respect to FIG. 6.

The pins 25P, 26P and 27P of the IC chip 19' are respectively connected with the circuit elements of an external circuit such as a variable filter circuit 38 for the left channel, and the pins 16P, 17P and 18P are respectively connected with the circuit elements of an external circuit such a variable filter circuit 38 for the right channel. Both the variable filter circuits 38 for the left and right channels are the same in construction and will be described later in detail with reference to FIG. 11.

The digital control signal generator 20 will be described in detail with reference to FIG. 12 but will be described generally here. In FIG. 3, 21 designates a shift register which is supplied with a clock signal and a data signal from the micro processor 10 through the pins 24P and 23P of the IC chip 19'. The output from the shift register 21 is fed to a latch circuit 22. When a strobe signal from the micro processor 10 is supplied through the pin 22P of the IC chip 19' to the latch circuit 22, it latches the contents of the shift register 21. The output from the latch circuit 22 is fed to a decoder 23 to be decoded. The decoded output therefrom is fed to a drive circuit 24 whose output is used to ON-and OFF-control the respective switches (electronic switches) of the circuit consisting of the resister circuits and switch circuits formed in the IC chip 19' of the left and right channel audio signal control circuits 14L and 14R. The pin 21P of the IC chip 19' is connected with a ground terminal of the micro processor 10, and the pins 20P and 19P of the IC chip 19' are respectively connected to positive and negative DC voltage sources +B and —B, respectively. In FIG. 3, 54L and 54R are respectively output terminals for the left and right channel audio signals.

Figure 4:
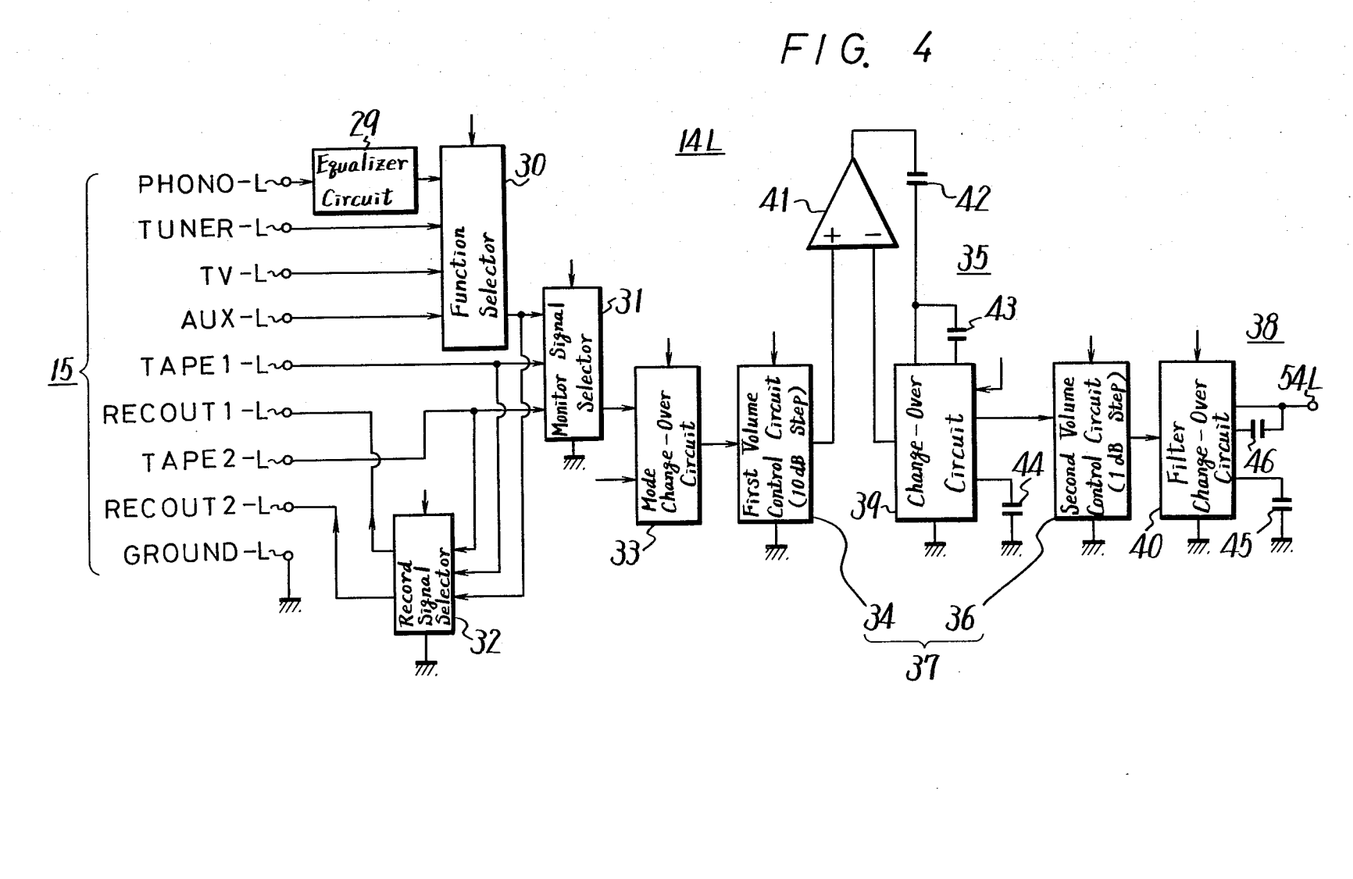

Turning to FIG. 4, the left channel audio signal control circuit 14L will be generally described. Since the right channel audio signal control circuit 14R is substantially the same as that of the control circuit 14L, its detailed description will be omitted.

In FIG. 4, 30 designates a function selector circuit which selects one of the audio signals from the terminals PHONO-L, TUNER-L, TV-L and AUX-L and supplies the selected audio signal to a monitor signal selector circuit 31. The monitor signal selector circuit 31 selects one of the respective audio signals from the function selector 30 and terminals TAPE 1-L and TAPE 2-L as a monitor signal and supplies the same to a mode change-over circuit 33. A record signal selector circuit 32 is provided which selects one of the audio signals from the function selector 30 and the terminals TAPE 1-L and TAPE 2-L and selectively supplies the same to the terminals RECOUT 2-L and RECOUT 1-L. In the stereo mode, the monitor signal delivered from the monitor signal selector 31 passes as it is through the mode change-over circuit 33, but in the monaural mode, the monitor signals for the left and right channels are added to the former monitor signal in the mode change-over circuit 33.

A sound volume adjusting circuit (variable attenuating circuit) 37 is formed of a first sound volume adjusting or control circuit 34 of 10 dB steps and a second sound volume adjusting or control circuit 36 of 1 dB steps. Between the volume adjusting circuits 34 and 36 is provided the tone adjusting circuit 35 which also serves as a buffer amplifier. The output audio signal from the mode change-over circuit 33 is fed to the first volume control circuit 34. The tone adjusting circuit 35 is formed of a change-over circuit 39, which consists of a resistor and a switch, and is made in the IC chip 19' and an external circuit. The output audio signal from the second volume control circuit 36 is fed to a variable filter or filter change-over circuit 38 which is formed of a change-over circuit 40 including a resistor, a switch, and an external circuit. The output terminal of the variable filter circuit 38 is connected to the output terminal 54L. The left channel audio signal appearing at the output terminal 54L is fed to a power amplifier (not shown) and its output is then fed to a left speaker (not shown). The respective circuits 30, 31, 32, 33, 34, 36, 39 and 40 are each formed of the circuit including the resistors and switches, made in the IC chip 19', and the respective switches thereof are ON- and OFF-controlled by the control signals from the drive circuit 24 shown in FIG. 3.

Figure 5:
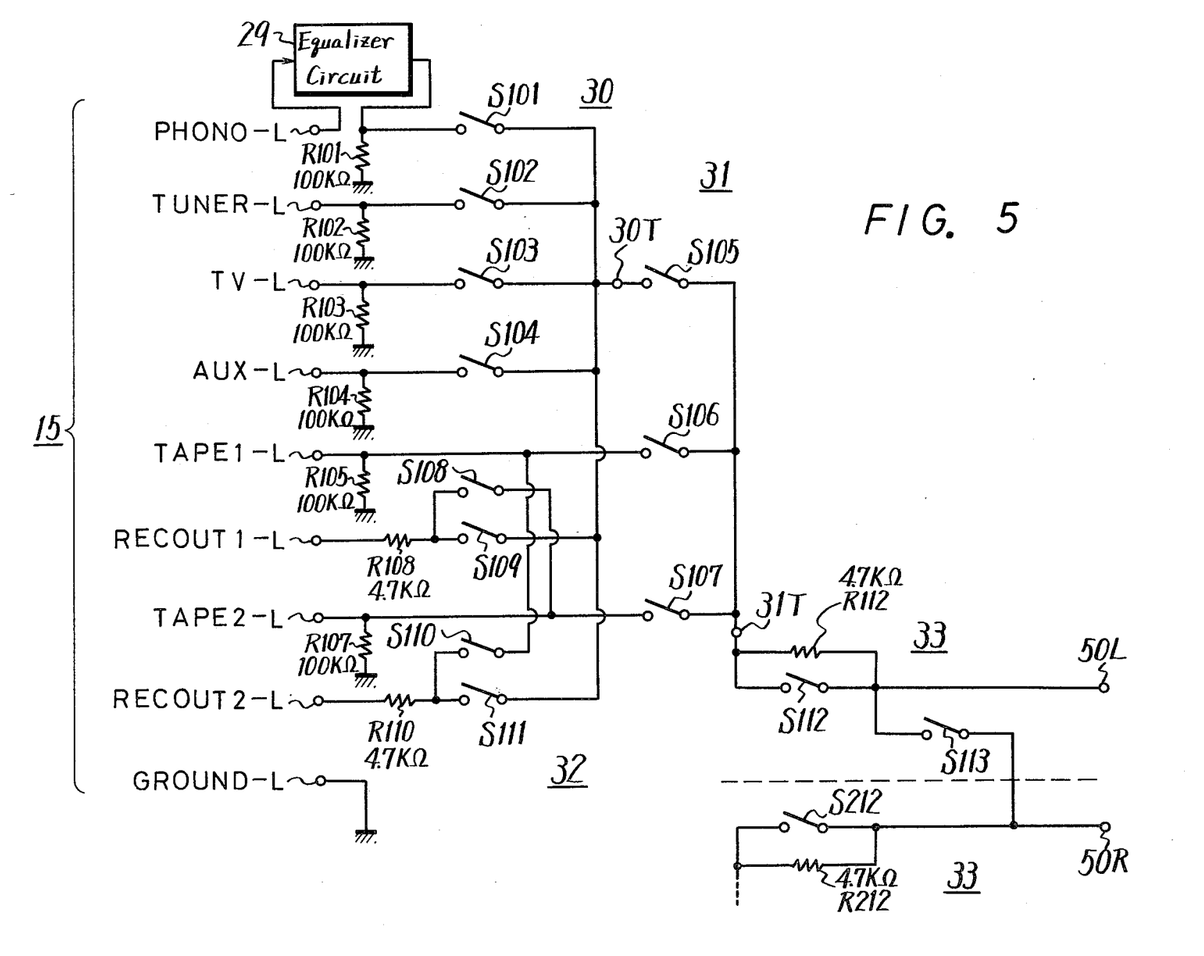
FIG. 5 is a connection diagram showing an example of the function selector according to the invention.

Turning to FIG. 5, practical examples of the function selector 30, monitor signal selector 31, record signal selector 32, and mode change-over circuit 33 will be described in detail.

The function selector 30 will be first described. The terminals PHONO-L, TUNER-L, TV-L and AUX-L are respectively grounded through resistors R101, R102, R103 and R104, each having the resistance value of 100 KΩ, and conected together through switches S101, S102, S103 and S104 for function change-over to a terminal 30T. When one of these switches is selectively made ON, a selected audio signal is delivered to the output terminal 30T.

Next, the monitor signal selector 31 will be described. The terminals TAPE 1-L and TAPE 2-L are respectively grounded through resistors R105 and R107 each having the resistance value of 100 KΩ, and the terminals 30T, TAPE 1-L and TAPE 2-L are connected through switches S105, S106 and S107 together to a terminal 31T. Thus, when one of these switches is selectively made ON, the selected monitor signal is delivered to the terminal 31T.

Next, the record signal selector 32 will be described. The terminal RECOUT 1-L is connected through a resistor R108 of 4.7 KΩ and a switch S108 to the terminal TAPE 2-L and through a switch 109 to the terminal 30T. The terminal RECOUT 2-L is connected through a resistor R110 of 4.7 kΩ and a switch S110 to the terminal TAPE 1-L and through a switch S111 to the terminal 30T. When one of these switches is selectively made ON, one of the audio signals selected by the function selector 30 is fed to either of the terminals RECOUT 1-L or RECOUT 2-L as the record signal, and the reproduced signal from the terminal TAPE 1-L or TAPE 2-L is fed to the terminal RECOUT 2 -L or RECOUT 1-L as the record signal, respectively.

Now, the mode change-over circuit 33 will be described. The terminal 31T is connected through a parallel connection of a resistor R112 of 4.7 kΩ and a switch S112 to a terminal 50L. In the mode change-over circuit 33 for the right channel, a parallel connection of a resistor R212 of 4.7 KΩ and a switch S212 is connected to a terminal 50R. Between the terminals 50L and 50R is provided a switch S113. In the stereo mode, the switches S112 and S212 are made ON while the switch S113 is made OFF. Meantime, in the monaural mode, the S112 and S212 are made OFF but the switch S113 is made ON, so that the sum signal of the left and right channel audio signals is delivered to the respective terminals 50L and 50R.

Figure 6:
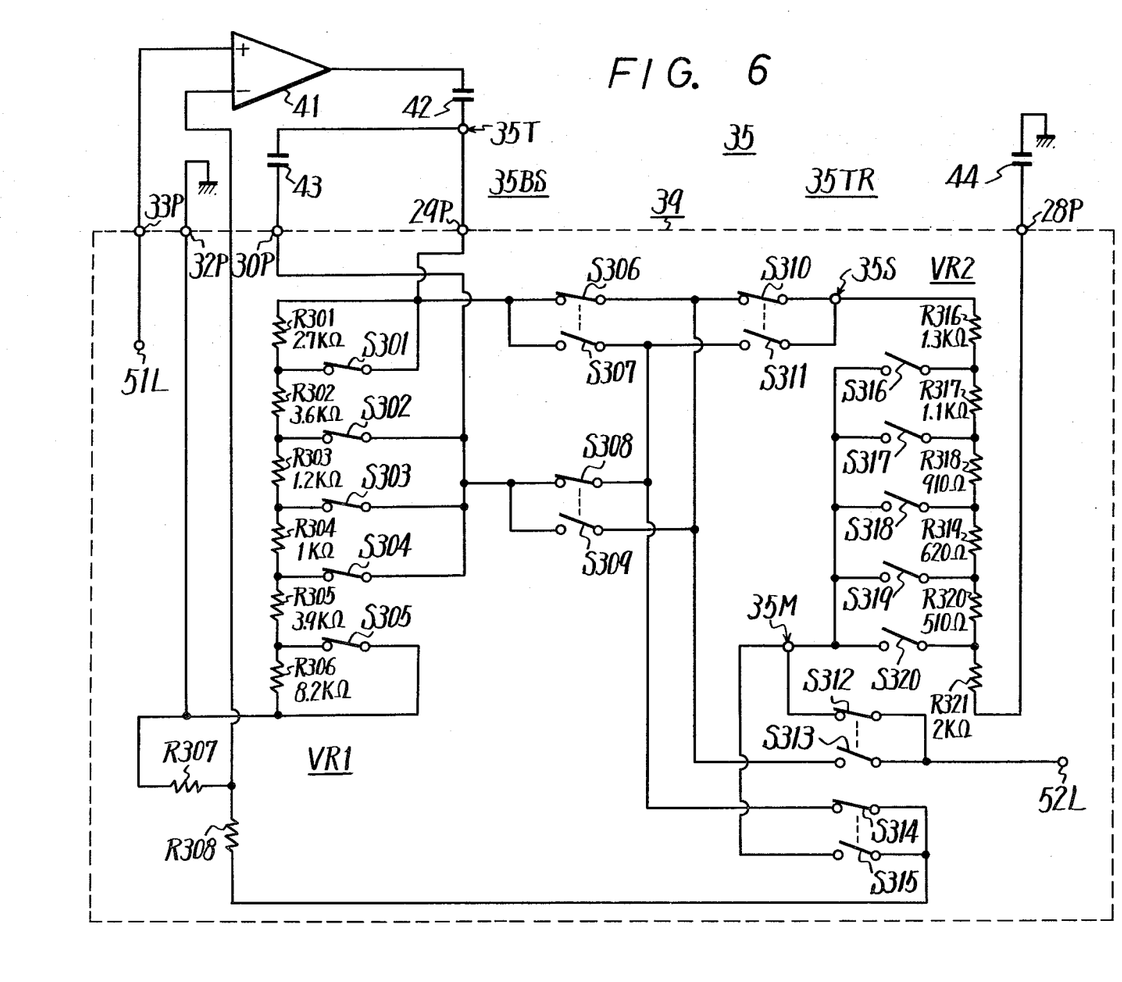
FIGS. 6 to 10, inclusive, are connection diagrams respectively showing an example of the tone control circuit according to the invention.

Turning to FIG. 6, a practical example of the tone adjusting circuit 35 will be described. In FIG. 6, the change-over circuit 39 is made of resistors and switches and formed integral with the IC chip 19'. In this case, the external circuit is formed of an operational amplifier 41, a capacitor 42 (of large capacity), a bass capacitor 43 and a treble capacitor 44. A bass control circuit 35 BS for controlling the level increase and decrease of low frequency components is provided which consists of the amplifier 41, bass capacitor 43, a potentiometer VR1, and switches S306 to S309. A treble control circuit 35TR for adjusting the level increase and decrease of high frequency components is also provided which consists of the amplifier 41, treble capacitor 44, a potentiometer VR2, and switches S310 to S315, respectively.

An output terminal 51L of the first volume control circuit 34 (shown in FIG. 4) is connected through the pin 33P to a non-inverted input terminal of the amplifier 41 which is thus supplied with the input audio signal. The output terminal of the amplifier 41 is connected through the capacitor 42 to a connection point 35T which is grounded through the pin 29P and a series circuit of the resistors R301 (2.7 KΩ)-R302 (3.6 KΩ)-R303(1.2 KΩ)-R304 (1 KΩ)-R305 (3.9 KΩ)-R306 (8.2 KΩ), which form the potentiometer VR1, and is connected to the connection point between the resistors R301 and R302 through a switch S301. The connection point 35T is further connected through the bass capacitor 43, pin 30P and switches S302, S303 and S304 to connection points between resistors R302 and R303; R303 and R304; and R304 and R305, respectively. The connection point between the resistors R305 and R306 is grounded through a switch S305 and pin 32P. By making the switches S301 to S305 ON and OFF selectively, the bass control (or the level adjustment of the low frequency components for the increase or decrease from the reference level) is carried out.

A connection point 35S is grounded through a series circuit of resistors R316 (1.3 KΩ)-R317(1.1 KΩ)-R318(910Ω)-R319(620Ω)-R320(510Ω)-R321(2 KΩ), which form the treble potentiometer VR2, the pin 28P, and the treble capacitor 44. A connection point 35M is connected through switches S316, S317, S318, S319 and S320 to the respective connection points between the resistors R316 and R317; R317 and R318; R318 and R319; R319 and R320; and R320 and R321. Thus, by making these switches ON and OFF selectively, the treble control (the level adjustment of the high frequency component for the increase or decrease from the reference level) is carried out.

The switches S306 to S309 and those S310 to S315 are respectively switch groups for changing over the positive, negative, and defeat of the bass control circuit 35BS and the treble control circuit 35 TR. The respective switch pairs S306 and S307; and S308 and S309; S310 and S311; S312 and S313; and S314 and S315 are so changed over in ganged relation that when one of switches of each pair is ON, the other of each pair is OFF as shown in FIG. 6. The connection point 35T is connected through the capacitor 43, pin 30P and series connection of the switches S306 and S310, and also through the series connection of the switches S307 and S311 to the connection point 35S. The connection point 35T is further connected through the capacitor 43, pin 30P and switch S308 to the connection point between the switches S307 and S311 and also through the switch S309 to the connection point between the switches S306 and S310. A terminal 52L, at which an output audio signal is provided, is connected through the switch S312 to the connection point 35M and also through the switch S313 to the connection point between switches S306 and S310.

In the example of FIG. 6, a voltage divider is provided by resistors R307 and R308 (which voltage divider may be omitted) and the connection point between the resistors R307 and R308 is connected to the inverted input terminal of the amplifier 41. In this voltage divider, one end of the resistor R307 is grounded through the pin 32P and one end of the other resistor R308 is connected through the switch S314 to the connection point between the switches S307 and S311 and also through the switch S315 to the connection point 35M.

Now, the tone adjusting by the ON and OFF operation of the switches S301 to S315 will be described with reference to the following Tables 1 to 4 in which the adjusting states of the bass and treble in response to ON "1" and OFF "0" of the switches S301 to S315 are respectively shown.

TABLE 1

| | Bass | | | |
|---|---|---|---|---|
| | S306 | S307 | S308 | S309 |
| + | 1 | 0 | 1 | 0 |
| 0 | 1 | 1 | 1 | 1 |
| − | 0 | 1 | 0 | 1 |

TABLE 2

| | Treble | | | | | |
|---|---|---|---|---|---|---|
| | S310 | S311 | S312 | S313 | S314 | S315 |
| − | 1 | 0 | 1 | 0 | 1 | 0 |
| 0 | 0 | 1 | 0 | 1 | 1 | 1 |
| + | 0 | 1 | 0 | 1 | 0 | 1 |

TABLE 3

| | Bass | | | | |
|---|---|---|---|---|---|
| | S301 | S302 | S303 | S304 | S305 |
| 0 | 0 | 0 | 0 | 0 | 0 |
| ±2 | 1 | 1 | 0 | 0 | 0 |
| ±4 | 1 | 1 | 0 | 0 | 1 |
| ±6 | 1 | 0 | 1 | 0 | 1 |
| ±8 | 1 | 0 | 0 | 1 | 1 |
| ±10 | 0 | 0 | 0 | 1 | 1 |

TABLE 4

| | Treble | | | | |
|---|---|---|---|---|---|
| | S316 | S317 | S318 | S319 | S320 |
| 0 | 0 | 0 | 0 | 0 | 0 |
| ±2 | 1 | 0 | 0 | 0 | 0 |
| ±4 | 0 | 1 | 0 | 0 | 0 |
| ±6 | 0 | 0 | 1 | 0 | 0 |
| ±8 | 0 | 0 | 0 | 1 | 0 |
| ±10 | 0 | 0 | 0 | 0 | 1 |

Tables 1 and 2 respectively show the changed over states of positive (increase), negative (decrease) and zero (flat or defeat) of the respective switches for the reference levels of the bass and treble, and Tables 3 and 4 show the control states by ±2 dB steps of the bass and treble, respectively.

The equivalent circuits of the tone adjusting circuit 35 shown in FIG. 6 by the combination adjustment of the positive and negative of the bass and treble are respectively shown in FIGS. 7 to 10. In these equivalent circuits, the bass control circuit 35BS is a circuit wherein the bass capacitor 43 is connected in parallel between one end (hot end) of the potentiometer VR1 and its movable terminal, while the treble control circuit 35TR is a circuit that has the potentiometer VR2 connected in series to the treble capacitor 44 at the ground side the former. However, the relation among the connections of the control circuits 35BS, 35TR, operational amplifier 41 and terminal 52L at which the output audio signal is obtained, is changed dependent upon the respective equivalent circuits.

Figure 7:
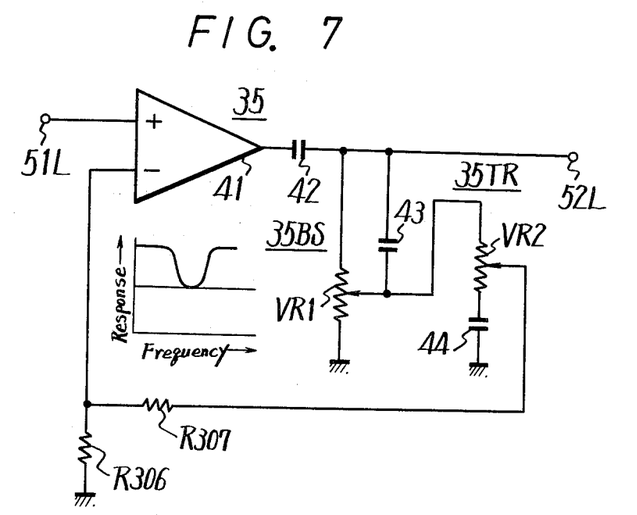

The equivalent circuit of FIG. 7 corresponds to a case where the base is positive for the reference level (defeat level) and the treble is also positive for the reference level (defeat level), and that the bass control circuit 35BS is connected in parallel to the output side of the amplifier 41, the movable contact of the potentiometer VR1 of the bass control circuit 35BS is connected to one end (hot end) of the potentiometer VR2 of treble control circuit 35TR, and the output voltage appearing at the movable contact of the potentiometer VR2 of treble control circuit 35TR is divided and then negatively fed back to the amplifier 41.

Figure 8:
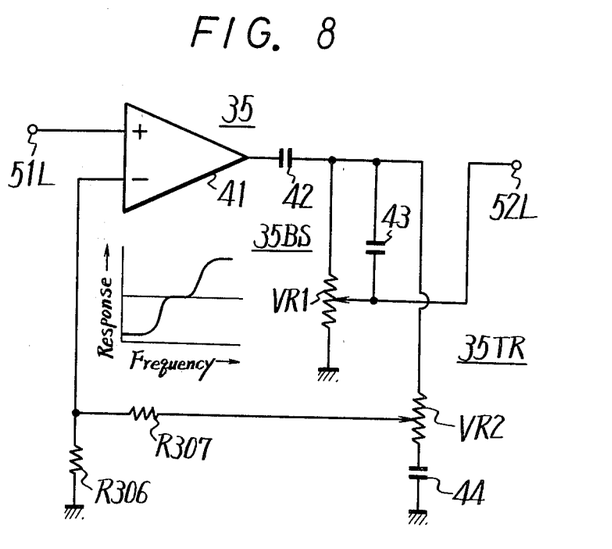

The equivalent circuit of FIG. 8 corresponds to a case where the bass is negative for the reference level and the treble is positive for the reference level, and wherein the bass and treble control circuits 35BS and 35TR are both connected in parallel to the output side of the amplifier 41, the movable contact of the potentiometer VR1 is connected to the terminal 52L, and the output voltage obtained at the movable contact of the potentiometer VR2 is divided and then negatively fed to the amplifier 41.

Figure 9:
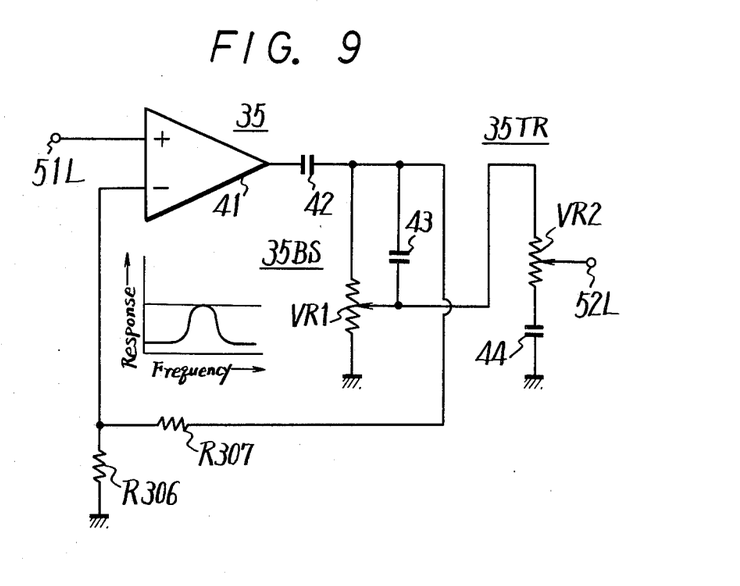

The equivalent circuit of FIG. 9 corresponds to a case where the bass and treble are both negative for the reference level, and that the bass control circuit 35 BS is connected in parallel to the output side of the amplifier 41, the output voltage obtained at one end (hot end) of the potentiometer VR1 is negatively fed back to the amplifier 41, the movable contact of the potentiometer VR1 is connected to one end (hot end) of the potentiometer VR2 of the treble control circuit 35TR, and the movable contact of the potentiometer VR2 is connected to the terminal 52L.

Figure 10:
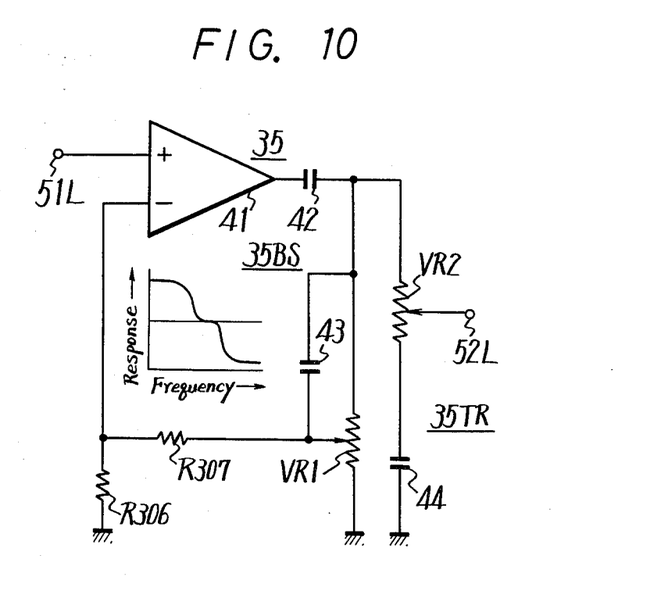

The equivalent circuit of FIG. 10 corresponds to a case where the bass is positive for the reference level but the treble is negative for the reference level, and that the bass and treble control circuits 35BS and 35TR are both connected in parallel to the output side of the amplifier 41, the output voltage obtained at the movable contact of the potentiometer VR1 is divided, then negatively fed back to the amplifier 41, and the movable contact of the potentiometer VR2 is connected to the terminal 52L.

Figure 11:
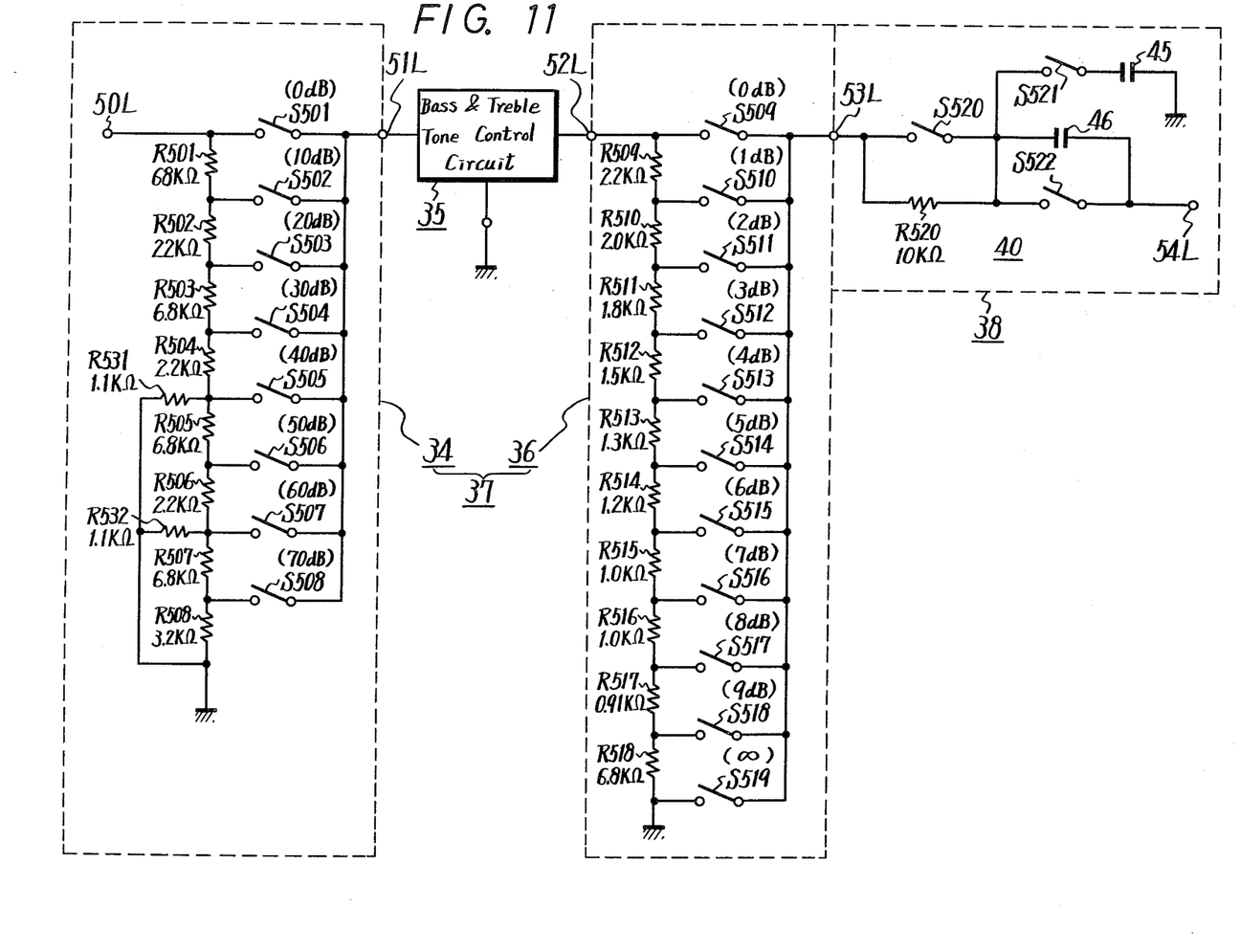
FIG. 11 is a connection diagram showing an example of the volume control circuit according to the invention.

Turning to FIG. 11, the volume control (variable attenuator) circuit 37 consisting of the first and second volume control circuits 34 and 36, and filter change-over circuit 38 will be practically described.

First, the volume control circuit 37 will be described. As described previously, this volume control circuit 37 is formed of the first variable attenuator or volume control circuit 34 of 10 dB steps and the second variable attenuator or volume control circuit 36 of 1 dB steps which are connected in cascade through the tone adjusting circuit 35 of the active type as a buffer circuit.

Now, the first volume adjusting or control circuit 34 will be first described. The terminal 50L, to which the input audio signal is applied, is connected to the ground through a series circuit of resistors R501(68 kΩ)-R502(22 KΩ)-R503(6.8 KΩ)-R504(2.2 KΩ)-R505(6.8 KΩ)-R506(2.2 KΩ)-R507(6.8 KΩ)-R508(3.2 KΩ). The connection point between the resistors R504 and R505 is grounded through a resistor R531 of 1.1 KΩ, and the connection point between the resistors R506 and R507 is also ground through a resistor R532 of 1.1 KΩ. The respective connection points between the terminal 50L and the resistor R501; between the resistors R501 and R502; R502 and R503; R503 and R504; R504 and R505; R505 and R506; R506 and R507; and R507 and R508 are respectively connected through switches S501, S502, S503, S504, S505, S506, S507 and S508 together to the terminal 51L. In this case, the connective construction among the resistors R505 to R508, R531 and R532 is so selected that the resistance difference between resistors of high resistance is made small so it is suitable for construction as an IC. With the first volume control circuit 34, when the switches S501 to S508 are made ON sequentially one after another, the attenuation amount is varied at the step of 10 dB or 0, 10, 20, . . . 70 dB.

Figure 15:
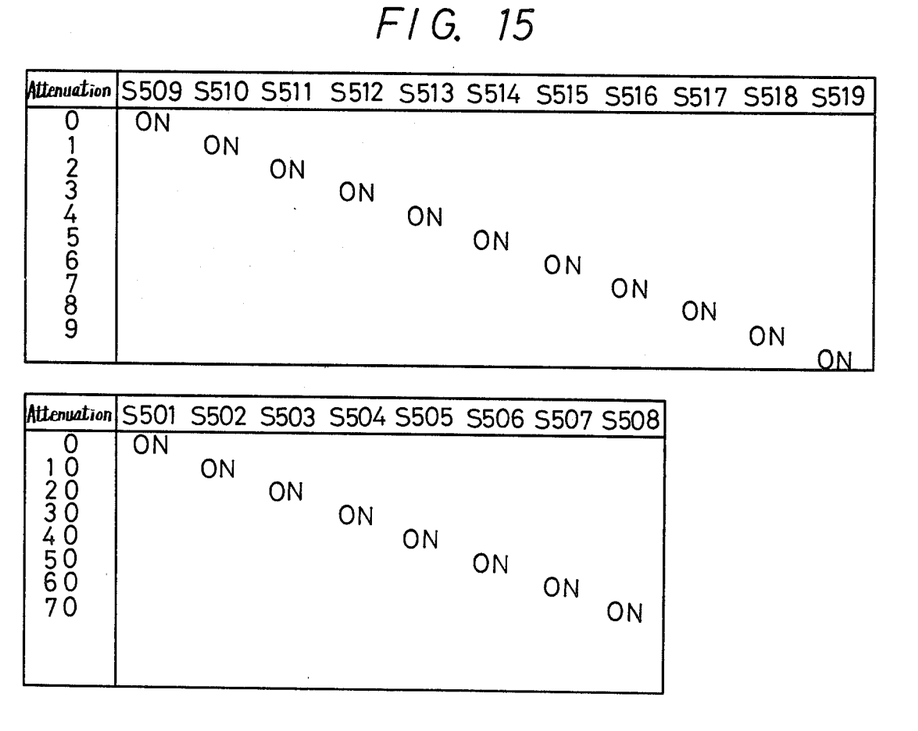
FIG. 15 is a comparative table showing the relation between respective switches of the volume control circuit used in the invention and attenuation amount.

Next, the second volume adjusting or control circuit 36 will be described. The terminal 52L, to which the input audio signal is applied, to grounded through a series connection of resistors R509(2.2 KΩ)-R510(2.0 KΩ)-R511(1.8 KΩ)-R512 (1.5 KΩ)-R513(1.3 KΩ)-R514(1.2 KΩ)-R515(1.0 KΩ)-R516(1.0 KΩ)-R517(0.91 KΩ)-R518(6.8 KΩ). The connection points between the terminal 52L and resistor R509; between resistors R509 and R510; R510 and R511; R511 and R512; R512 and R513; R513 and R514; R514 and R515; R515 and R516; R516 and R517; R517 and R518; and R518 and the ground are respectively connected through switches S509, S510, S511, S512, S513, S514, S515, S516, S517, S518 and S519 to a terminal 53L. With the second volume control circuit 36, when the switches S509 to S519 are made ON sequentially one after another, the attenuation amount is varied at the step of 1 dB or 0, 1, 2, . . . 9 dB and to ∞ dB as shown in the tables of FIG. 15.

According to the above volume control circuit 37, the attenuation amount is varied as 0, 1, 2, . . . 78, 79 dB and to ∞ dB, and further since the tone adjusting circuit 35 of the active type is provided between the first and second volume control circuits 34 and 36 as a buffer circuit of high input impedance and low output impedance characteristics, no error is generated in the attenuation amount irrespective of the operating positions of the switches S501 to S508 and the switches S509 to S519.

Next, the variable filter or filter change-over circuit 38 will be described. The terminal 53L to which the input audio signal is applied, is grounded through a series connection of switches S520, S521 and a capacitor 45. A resistor R520 (10 KΩ) is connected in parallel to the switch S520, and the connection point between the switches S520 and S521 is connected through a parallel connection of a capacitor 46 and a switch S522 to the terminal 54L.

With the above filter change-over circuit 38, when the switch S520 is OFF but the switch S521 is ON, a high-pass filter is formed, while when the switch S520 is ON but the switch S521 is OFF, the high-pass filter is released. Further, when the switch S520 is ON but the switch S522 is OFF, a low-pass filter is formed, while when switch S522 is ON, the low-pass filter is released.

Figure 12:
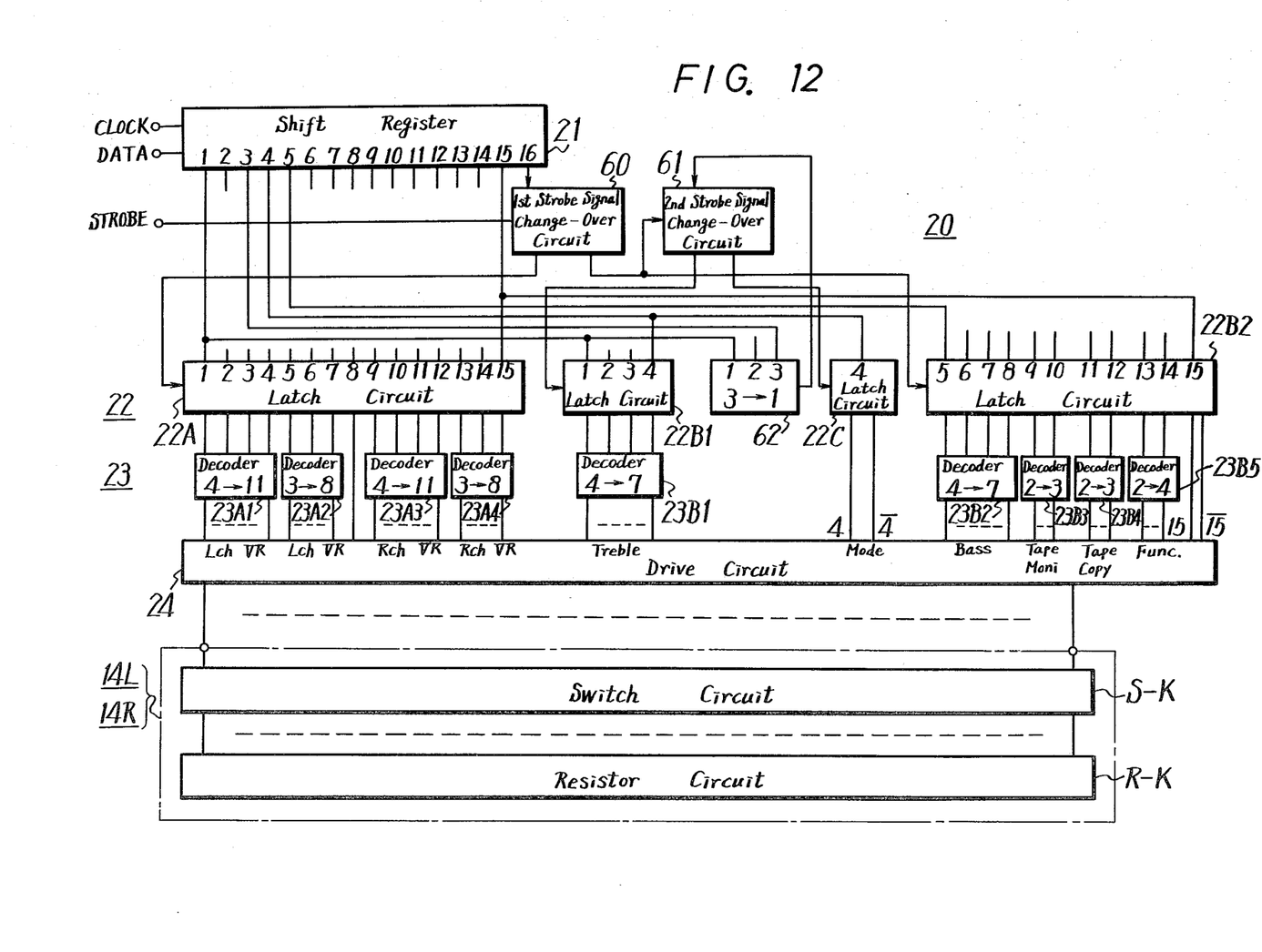
FIG. 12 is a block diagram showing a digital control system of the invention.

Turning to FIG. 12, the digital control signal generator 20 of the digital audio signal control circuit 19 will be now described. In the example of FIG. 12, the shift register 21 of 16 bits receives the clock signal and the data signal (serial binary coded signal) from the micro processor 10 shown in FIG. 2 and produces a parallel binary coded signal of 16 bits.

Figure 13:
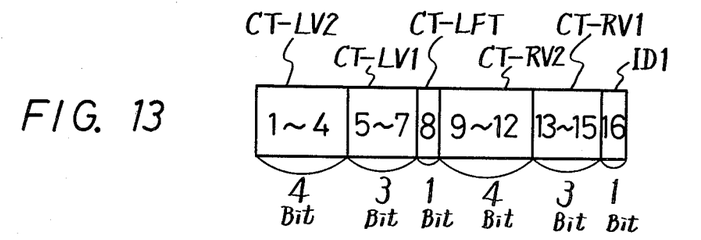
FIGS. 13 and 14 are tables respectively showing the contents of respective words of digital coded signals used in the invention.
Figure 14:
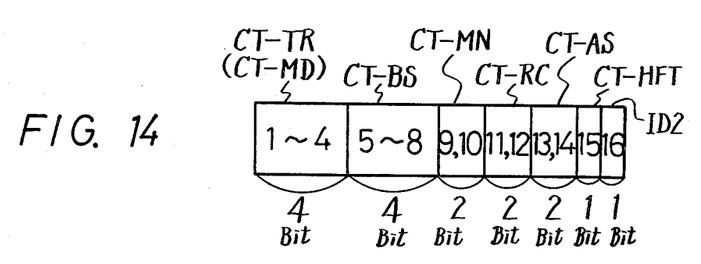

Now, the data signal will be described with reference to FIGS. 13 and 14. The data signal is composed of two kinds of word signals each being of 1 word of 16 bits. The construction of the first word signal is shown in FIG. 13. First to fourth bit signals of the first word signal form a digital signal CT-LV2 for controlling the attenuation amount of the second volume control circuit 36 for the left channel; fifth to seventh bit signals of the first word signal form a digital signal CT-LV1 for controlling the attenuation amount of the first volume control circuit 34 for the left channel; the eighth bit signal of the first word signal forms a digital signal CT-LFT for controlling the ON and OFF of the low-pass filter in the filter change-over circuits 38 for the left and right channels; ninth to twelfth bit signals of the first word signal form a digital signal CT-RV2 for controlling the attenuation amount of the second volume control circuit 36 for the right channel; thirteenth to fifteenth bit signals of the first word signal form a digital signal CT-RV1 for controlling the attenuation amount of the first volume control circuit 34 for the right channel; and the sixteenth bit signal of the first word signal forms a word discrimination signal ID1 for two kinds of word signals which is "0" in case of the first word signal, by way of example.

Next, the construction of the second word signal will be described with reference to FIG. 14. first to fourth bit signals of the second word signal form a digital signal CT-TR for controlling the treble control circuits 35TR for the left and right channels and a digital signal CT-MD for controlling the mode change-over circuits 33 for the left and right channels; fifth to eighth bit signals of the second word signal form a digital signal CT-BS for controlling the bass control circuits 35BS of the left and right channels; ninth and tenth bit signals of the second word signal form a digital signal CT-MN for controlling the monitor signal selector circuits 31 of the left and right channels; eleventh and twelfth bit signals of the second word signal form a digital signal CT-RC for controlling the record signal selector circuits 32 of the left and right channels; thirteenth and fourteenth bit signals of the second word signal form a digital signal CT-AS for controlling the function selector circuits 30 of the left and right channels; the fifteenth bit signal of the second word signal forms a digital signal CT-HFT for controlling the ON and OFF of the high-pass filter in the filter change-over circuits 38 of the left and right channels; and the sixteenth bit signal of the second word signal forms a word discrimination signal ID2 which is "1" for the second word signal, by way of example.

Turning back to FIG. 12, the latch circuit 22 is formed of latch circuits 22A, 22B1, 22B2 and 22C. A first strobe signal change-over circuit 60 is provided which receives the strobe signal from the micro processor 10 of FIG. 2 and selectively supplies the strobe signal to the latch circuit 22A or second strobe signal change-over circuit 61 in response to the condition of the sixteenth bit signal or word identification signals ID1 and ID2 from the shift register 21.

The latch circuit 22A is also supplied with in parallel the first to fifteenth bit signals from the shift register 21 and latches these bit signals when the sixteenth bit signal from the shift register 21 is "0" or word identification signal ID1. The output signals from the latch circuit 22A are fed to the decoder 23 or decoders 23A1, 23A2, 23A3 and 23A4, respectively, to be decoded. The decoder 23A1 is supplied with or receives the parallel binary coded control signal CT-LV2 of 4 bits, then produces eleven control signals in decimal number and supplies the same to the drive circuit 24. The decoder 23A2 receives the parallel binary coded control signal CT-LV1 of 3 bits, produces eight control signals and supplies the same to the drive circuit 24. The decoder 23A3 receives the parallel binary coded control signal CT-RV2 of 4 bits, produces eleven control signals and supplies the same to the drive circuit 24. The decoder 23A4 receives the parallel binary coded control signal CT-RV1 of 3 bits, produces eight control signals, and supplies the same to the drive circuit 24. The digital control signal CT-LFT is supplied directly from the latch circuit 22A to the drive circuit 24.

The latch circuit 22B2 is supplied with the fifth to fifteenth parallel binary coded signals from the shift register 21 and latches the same when the sixteenth bit signal from the shift register 21 is "1" or the second word identification ID2 is delivered from the shift register 21. The output signals from the latch circuit 22B2 are respectively fed to decoders 23B2, 23B3, 23B4 and 23B5 to be decoded. The decoder 23B2 receives the control digital signal of 4 bits, produces seven control signals and applies the same to the drive circuit 24. The decoder 23B3 receives the control digital signal CT-MN of 2 bits, produces three control signals, and applies the same to the drive circuit 24. The decoder 23B4 receives the control digital signal CT-RC of 2 bits, produces three control signals, and applies the same to the drive circuit 24. The decoder 23B5 receives the digital control signal CT-AS of 2 bits, produces four control signals, and applies the same to the drive circuit 24, respectively, The control digital signal CT-HFT consisting of in-phase and opposite phase components of the fifteenth bit signal is supplied directly from the latch circuit 22B2 to the drive circuit 24.

The second strobe signal change-over circuit 61 receives the strobe signal from the first strobe signal change-over circuit 60 when the sixteenth bit signal is "1" or word identification signal ID2 is delivered. A discriminator or detector circuit 62 is provided which receives the first to third coded signals from the shift register 21 and discriminates first and second ranges, where the first range is 3 to 13 in 0 to 15, which is provided by converting the binary number of 4 figures into a decimal number, and the second range is the remainder of the first range. The discriminated output from the detector circuit 62 is fed to the second strobe signal change-over circuit 61.

The latch circuit 22B1 is supplied with the first to fourth parallel bit signals from the shift register 21, receives the strobe signal from the second strobe signal change-over circuit 61 when the discriminated output from the discriminator circuit 62 is in the first range, and latches the first to fourth bit signals. The latched output from the latch circuit 22B1 is applied to a decoder 23B1. This decoder 23B1 receives the control digital signal CT-TR of 4 bits, produces seven control signals and applies the same to the drive circuit 24.

The latch circuit 22C is supplied with the fourth bit signal from the shift register 21, receives the strobe signal from the second strobe signal change-over circuit 61 when the discriminated output from the discriminator circuit 62 is in the second range, and latches the fourth bit signal. The latched fourth bit signal or control digital signal CT-MD is directly applied to the drive circuit 24.

Thus, the drive circuit 24 is supplied with 66 control signals altogether and applies its output signals to switch circuits S-K of the left and right channel audio signal control circuits 14L and 14R to control 109 switches in all. A resistor circuit R-K including 86 resistors is connected to the switch circuit S-K.

The present invention described above is suitable for construction as an IC and provides a digital gain control apparatus whose gain can be easily controlled by applying thereto a digital signal.

The apparatus of the invention can be applied not only to an audio signal but also to a video signal and so on with the same effect.

It will be apparent that many modifications and variations could be effected by one skilled in the art without departing from the spirit or scope of the novel concepts of the present invention.

We claim as our invention:

1. A digital gain control apparatus comprising:
(a) a micro processor means for producing a plurality of serial-binary coded signals, a clock signal, and a strobe signal;
(b) a one chip integrated circuit divided into an analog signal processing section and a digital control section;
(c) said digital control section comprising:
a shift register supplied with the plurality of serial-binary coded signals and the clock signal from the micro processor means,
latch circuit means connected to the output of said shift register and supplied with the strobe signal from said micro processor means to convert said plurality of serial-binary coded signals into a plurality of parallel-binary coded signals, and
decoder means connected to the output of said latch circuit means to produce a plurality of control signals from said plurality of parallel-binary coded signals; and
(d) said analog signal processing section comprising:
function selector means; and
volume adjusting means for a selected function, the selector means and volume adjusting means being connected to the output of said decoder means and controlled by said plurality of control signals.

2. A digital gain control apparatus according to claim 1, in which said volume adjusting means comprises:
(a) a first resistive attenuator comprising a first set of serially connected resistors having intermediate taps and connected between an output of said function selector means and a reference point, and a first set of ON/OFF switches, an end of each being connected to the intermediate taps of said first set of resistors, respectively and the other end of each being connected to each other;
(b) a buffer amplifier having an input terminal connected to the connection point of the other end of each of said first set of ON/OFF switches and an output terminal; and
(c) a second resistive attenuator consisting of a second set of serially connected resistors having intermediate taps connected between the outputs of said buffer amplifier and said reference point, and a second set of ON/OFF switches, one end of each being connected to the intermediate taps of said second set of resistors, respectively, and the other end of each being connected to each other and to an output terminal of said volume adjusting means.

3. A digital gain control apparatus according to claim 2, in which the resistance values of said first set of resistors is determined such that said first resistive attenuator is controlled by approximately 10 dB steps in response to the ON/OFF operation of said first set of ON/OFF switches.

4. A digital gain control apparatus according to claim 2, in which the resistance value of said second set of resistors is determined such that said second resistive attenuator is controlled by approximately 1 dB steps in response to the ON/OFF operation of said second set of ON/OFF switches.

5. A digital gain control apparatus according to claim 2, in which said buffer amplifier includes a bass and treble tone control circuit.

6. A digital gain control apparatus according to claim 1, in which said micro-processor means includes a memory connected thereto.

7. A digital gain control apparatus according to claim 1 wherein
said analog processing section further includes bass and treble tone control means, the bass and treble tone control means being connected to the output of said decoder means and controlled by said plurality of control signals.

* * * * *